US009024611B2

(12) United States Patent
Lee et al.

(10) Patent No.: US 9,024,611 B2
(45) Date of Patent: May 5, 2015

(54) CONTROLLER AND CONVERTING CONTROLLER WITH MULTI-FUNCTION PIN

(75) Inventors: Li-Min Lee, New Taipei (TW); Quan Gan, Wuxi (CN); Shian-Sung Shiu, New Taipei (TW); Chung-Che Yu, New Taipei (TW)

(73) Assignee: Green Solution Technology Co., Ltd., New Taipei (TW)

( * ) Notice: Subject to any disclaimer, the term of this patent is extended or adjusted under 35 U.S.C. 154(b) by 276 days.

(21) Appl. No.: 13/585,811

(22) Filed: Aug. 14, 2012

(65) Prior Publication Data

US 2013/0271097 A1    Oct. 17, 2013

(30) Foreign Application Priority Data

Apr. 16, 2012    (CN) .......................... 2012 1 0110891

(51) Int. Cl.
| | |
|---|---|
| G05F 1/10 | (2006.01) |
| H02M 3/156 | (2006.01) |
| H02M 1/32 | (2007.01) |
| H01L 21/00 | (2006.01) |
| H02H 3/10 | (2006.01) |
| H02H 7/122 | (2006.01) |
| H02M 3/158 | (2006.01) |

(52) U.S. Cl.
CPC .............. *H02M 3/156* (2013.01); *H02M 3/158* (2013.01); *H02M 1/32* (2013.01); *H01L 21/00* (2013.01); *H02H 3/10* (2013.01); *H02H 7/1222* (2013.01); *H02H 7/1227* (2013.01)

(58) Field of Classification Search
CPC .................... H02M 3/156–3/158; H01L 21/00; H02H 3/10; H02H 7/1222; H02H 7/1227

USPC ......... 323/271, 282–290, 220–224, 311–312, 323/315
See application file for complete search history.

(56) References Cited

U.S. PATENT DOCUMENTS

| | | | |
|---|---|---|---|
| 7,233,131 B2 | 6/2007 | Lin et al. | |
| 7,522,398 B2 * | 4/2009 | Tang .............................. | 361/93.9 |
| 7,541,795 B1 * | 6/2009 | Smith et al. .................... | 323/285 |
| 7,741,820 B2 | 6/2010 | Huang et al. | |
| 7,791,327 B2 | 9/2010 | Liu | |
| 2009/0167273 A1 * | 7/2009 | Liu .............................. | 323/285 |

FOREIGN PATENT DOCUMENTS

CN          102185484          9/2011

* cited by examiner

*Primary Examiner* — Timothy J Dole
*Assistant Examiner* — Shahzeb K Ahmad
(74) *Attorney, Agent, or Firm* — Jianq Chyun IP Office

(57) ABSTRACT

A controller with a multi-function pin, adapted to control a converting circuit according to a control signal for converting an input voltage into an output voltage, is disclosed. The controller has the multi-function pin, an enable unit, an over-current detecting unit and a logic control unit. The enable unit is coupled to the multi-function pin for receiving an enable signal and activates the controller in response to the enable signal. The over-current detecting is coupled to the multi-function pin and determines an over-current value according to an over-current set resistance coupled between the multi-function pin and a voltage source. The over-current detecting unit generates an over-current protection signal according to the over-current value and a current flowing through the converting circuit. The logic control unit determines whether executing an over-current protection according to the over-current protection signal.

14 Claims, 2 Drawing Sheets

CONTROLLER AND CONVERTING CONTROLLER WITH MULTI-FUNCTION PIN

CROSS-REFERENCE TO RELATED APPLICATION

This application claims the priority benefit of China application serial no. 201210110891.7, filed on Apr. 16, 2012. The entirety of the above-mentioned patent application is hereby incorporated by reference herein and made a part of this specification.

BACKGROUND

1. Field of the Invention

The present invention relates to a controller and a converting controller, and more particularly relates to a controller and a converting controller with multi-function pin.

2. Description of Related Art

An integrated circuit (IC) die is packaged in a package structure. The package structure is usually demanded for protecting the fragile die from outside damages of moisture, erosion, or impact, and transferring heat generated by the die. On the other hand, the package structure must be able to allow the exchange of signals between the die and the outside of the package structure.

The types of different package structures have different sizes, different amount of pins and different thermal resistances. When a new function of the integrated circuit is added, the amount of pins may be increased for receiving an input signal or/and transmitting an output signal corresponding to the new function. However, a cost of the package structure may be increased while increasing the amount of pins. With consideration for cost, how to make the same pin responding to two or more functions is an important issue in IC design.

SUMMARY

In the conventional arts, the package cost is increasing with the functions of IC increasing. The present invention performs functions of enabling and over-current setting at the same pin for enhancing the ability of the integrated circuit without extra package cost.

To accomplish the aforementioned and other objects, an exemplary embodiment of the invention provides a converting controller adapted to control a converting circuit for converting an input voltage into an output voltage. The converting controller has a multi-function pin, an enable unit, an over-current detecting unit, a feedback control unit and a logic control unit. The enable unit is coupled to the multi-function pin for receiving an enable signal and activates the converting controller in response to the enable signal. The over-current detecting unit is coupled to the multi-function pin and determines an over-current value according to an over-current set resistance coupled between the multi-function pin and a driving voltage source. The over-current detecting unit generates an over-current protecting signal according to the over-current value and a current flowing through the converting circuit. The feedback control unit generates a modulation signal according to a feedback signal indicative of the output voltage. The logic control unit is coupled to the over-current detecting unit and the feedback control unit. The logic control unit controls the converting circuit according the modulation signal and determines whether executing an over-current protection according to the over-current protection signal.

To accomplish the aforementioned and other objects, an exemplary embodiment of the invention further provides a controller adapted to control a converting circuit for converting an input voltage into an output voltage according to a control signal. The controller has a multi-function pin, an enable unit, an over-current detecting unit and a logic control unit. The enable unit is coupled to the multi-function pin for receiving an enable signal and activates the controller in response to the enable signal. The over-current detecting unit is coupled to the multi-function pin and determines an over-current value according to an over-current set resistance coupled between the multi-function pin and a driving voltage source. The over-current detecting unit generates an over-current protection signal according the over-current value and a current flowing through the converting circuit. The logic control unit is coupled to the over-current detecting unit. The logic control unit controls the converting circuit according to a control signal and determines whether executing an over-current protection according to the over-current protection signal.

It is to be understood that both the foregoing general description and the following detailed description are exemplary, and are intended to provide further explanation of the invention as claimed. In order to make the features and the advantages of the invention comprehensible, exemplary embodiments accompanied with figures are described in detail below.

BRIEF DESCRIPTION OF THE DRAWINGS

The present invention will now be specified with reference to its preferred embodiment illustrated in the drawings, in which.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
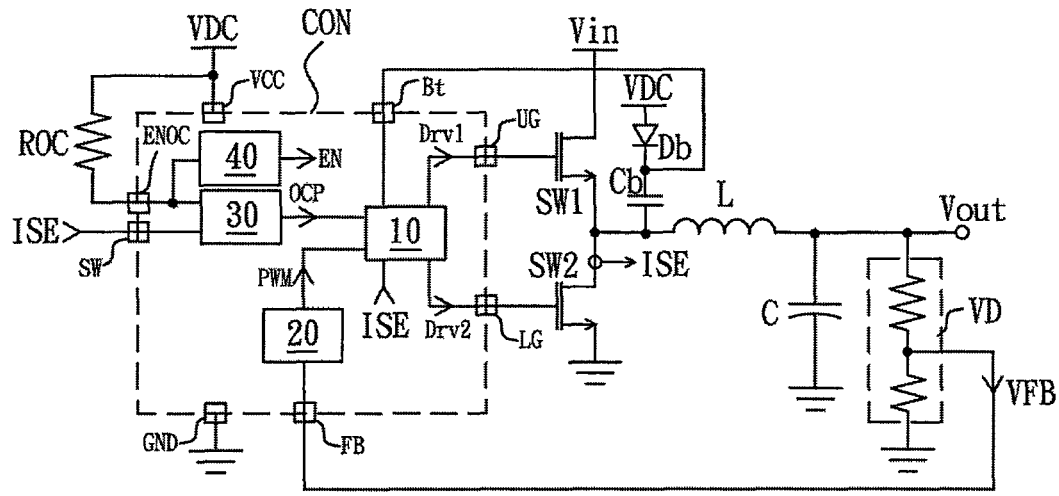
FIG. 1 is a schematic diagram of a converting controller with a multi-function pin according to an embodiment of the present invention.

FIG. 1 is a schematic diagram of a converting controller with a multi-function pin according to an embodiment of the present invention. The converting controller CON is adapted to control a converting circuit for converting an input voltage Vin into an output voltage Vout. In the present embodiment, the converting circuit is a DC to DC step-down converting circuit, which comprises a high-side transistor SW1, a low-side transistor SW2, an inductance L and a capacitance C. A first end (drain) of the high-side transistor SW1 is coupled to the input voltage Vin and a second end (source) is coupled to a first end (drain) of the low-side transistor SW2. A second end (source) of the low-side transistor SW2 is coupled to a common level (i.e., ground). An end of the inductance L is coupled to the first end of the low-side transistor SW2 and the other end thereof is coupled to the capacitance C. The converting controller CON generates driving signals Drv1 and Drv2 which are respectively transmitted to control ends (gates) of the high-side transistor SW1 and the low-side transistor SW2. The electric energy transmitted from the input voltage Vin is stored and converted by the inductance L and the capacitance C to generate the output voltage Vout. In the present embodiment, the high-side transistor SW1 and the low-side transistor SW2 are N-type MOSFETs. The converting controller CON may be extra added a bootstrap circuit to increase the voltage level of the driving signal Drv1 generated by the converting controller CON for making the voltage level of the driving signal Drv1 being enough to turn on the high-side transistor SW1. The bootstrap circuit comprises a boost diode Db and a boost capacitance Cb which are connected between the driving voltage VDC and the second end of the high-side transistor SW1. A connection node of the boost diode Db and the boost capacitance Cb is coupled to a bootstrap pin Bt of the converting controller CON for providing a voltage which can be higher than the level of the input voltage Vin. The bootstrap circuit can be omitted when the high-side transistor SW1 is a P-type MOSFET.

The converting controller CON comprises a logic control unit 10, a feedback control unit 20, an over-current detecting unit 30 and an enable unit 40. A driving voltage pin VCC of the converting controller CON is coupled to a driving voltage source VDC for receiving power, and a ground pin GND thereof is grounded. The feedback control unit 20 is coupled to a voltage detecting circuit VD via a feedback pin FB. The voltage detecting circuit VD detects the output voltage Vout for generating a feedback signal VFB indicative of a voltage level of the output voltage Vout. In the present embodiment, the voltage detecting circuit VD is a voltage divider circuit and comprises two resistances connected in series. The feedback control unit 20 generates a modulation signal PWM according to the feedback signal VFB and so a duty cycle of the modulation signal PWM is varied according to the voltage level of the output voltage Vout. The logic control unit 10 is coupled to the feedback control unit 20. The logic control unit 10 generates the driving signals Drv1, Drv2 at driving pins UG, LG respectively to turn on and off the high-side transistor SW1 and the low-side transistor SW2 in the converting circuit. The logic control unit 10 controls an amount of the power transmitted to the capacitance C and so the voltage level of the output voltage Vout is stabilized at a predetermined voltage value. A current detecting pin SW of the logic control unit 10 is coupled to the connection node of the high-side transistor SW1 and the low-side transistor SW2 for detecting a current of the inductance L. The current of the inductance L also flows through the low-side transistor SW2 for generating a current detecting signal ISE when the low-side transistor SW2 is turned on. At this time, the logic control unit 10 judges whether the current of the inductance L is decreased to be close zero according to the current detecting signal ISE and turns off the low-side transistor SW2 for avoiding a reverse current.

The enable unit 40 is coupled to a multi-function pin ENOC for receiving an enable signal EN and activates the converting controller CON when receiving the enable signal EN. In the present embodiment, an over-current set resistance ROC is coupled between the multi-function pin ENOC and a voltage source, e.g., the driving voltage source VDC in the present embodiment. The enable unit 40 judges whether the voltage level of the multi-function pin ENOC reaches an enable voltage level or not when the driving voltage source VDC is provided. The enable unit 40 generates the enable signal EN to activate other circuits in the converting controller CON if the voltage level of the multi-function pin ENOC reaches the enable voltage level. Wherein, the enable voltage level is higher than the shutdown voltage level. The over-current detecting unit 30 is coupled to the current detecting pin SW for receiving the current detecting signal ISE and also coupled to the multi-function pin ENOC for determining an over-current value by detecting a resistance value of the over-current set resistance ROC. The over-current detecting unit 30 generates an over-current protection signal OCP when the current of the inductance L exceeds the over-current value. The logic control unit 10 is coupled to the over-current detecting unit 30 and executes an over-current protection process according to the over-current protection signal OCP. The over-current protection process may be: a) temporarily stopping the power conversion of the converting circuit; b) decreasing the turn-on period of the high-side transistor SW1; or c) stopping the power conversion of the converting circuit until the converting controller CON is reset. In addition, the enable unit 40 may provide an function of UVLO (under voltage lockout) or a power on reset to activate the converting controller CON when a voltage level of the multi-function pin ENOC is higher than the enable voltage level and stop the converting controller CON when the voltage level of the multi-function pin ENOC is lower than a shutdown voltage level.

Figure 2:
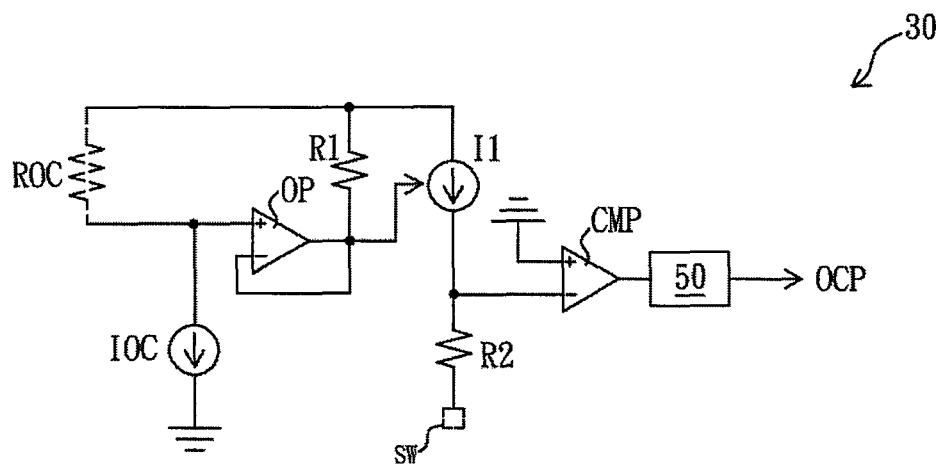
FIG. 2 is a schematic diagram of an over-current detecting unit according to an embodiment of the present invention.

FIG. 2 is a schematic diagram of an over-current detecting unit according to an embodiment of the present invention. The over-current detecting unit 30 comprises an over-current set current source IOC, a set comparator OP, a current resistance R1, a detecting resistance R2, a detecting current source I1, an over-current comparator CMP and a counter 50. The over-current set current source IOC provides a set current flowing through an over-current set resistance ROC and determines an over-current value according to a voltage across the over-current set resistance ROC. A non-inverting end of the set comparator OP is coupled to the over-current set resistance ROC and an inverting end thereof is coupled to an output end of the set comparator OP for serving as a voltage follower. The output end of the set comparator OP is coupled to the current resistance R1 and so a voltage across the current resistance R1 is equal to the voltage across the over-current set resistance ROC. The current of the current resistance R1 is (Vdc-Venoc)/r1, wherein Vdc is the voltage of the driving voltage source VDC, Venoc is the voltage of the multi-function pin ENOC and r1 is the resistance value of the current resistance R1.

The detecting current source I1 mirrors the current flowing through the current resistance R1 to generate a mirror current to the detecting resistance R2. An end of the detecting resistance R2 is coupled to a current detecting pin SW. Referring to the FIG. 1, a voltage cross the drain and the source of the low-side resistance SW2 due to an on-resistance of the low-side resistance SW2 when the high-side transistor SW1 is turned off and the low-side transistor SW2 is turned on. At this time, the voltage level of the drain is lower than the voltage level of the source (grounded, 0V).

A voltage level of the connection node of the detecting current source I1 and the detecting resistance R2 is higher than the voltage level of the current detecting pin SW when the current of the detecting current source I1 flows through the detecting resistance R2. A non-inverting end of the over-current comparator CMP is grounded and an inverting end thereof is coupled to the connection node of the detecting current source I1 and the detecting resistance R2. The voltage level of the connection node is lower 0V when the current flowing through the low-side transistor SW2 is too large. The over-current comparator CMP generates a high-level signal at this time. Accordingly, the over-current value determined by the over-current detecting unit 30 can be expressed as:

M*(Vdc−Venoc)*r2/(r1*Rdson), wherein M is a ratio of current mirror of the detecting current source I1, r2 is the resistance value of the detecting resistance R2 and Rdson is the turn-on resistance value of the low-side transistor SW2.

The turn-on resistance value Rdson of the low-side transistor SW2 is low and so the drain-source voltage of the low-side transistor SW2 is very low. Generally, the resistance value r2 of the detecting resistance R2 is determined to be lower than the resistance value r1 of the detecting resistance R1 or/and the ratio of current mirror M must be determined to be lower than 1.

The counter 50 is coupled to an output end of the over-current comparator CMP for counting times of the high-level signal generated by the over-current comparator CMP, i.e., counting the over-current times. The counter 50 generates an over-current protection signal OCP to activate the logic control unit 10 executing an over-current protecting process when the over-current times reaches a predetermined value. The counter 50 can be omitted according to actual application and the high level signal generated by the over-current comparator CMP can be as the over-current protection signal OCP. Namely, the over-current protection process is executed once the over-current is occurred.

Figure 3:
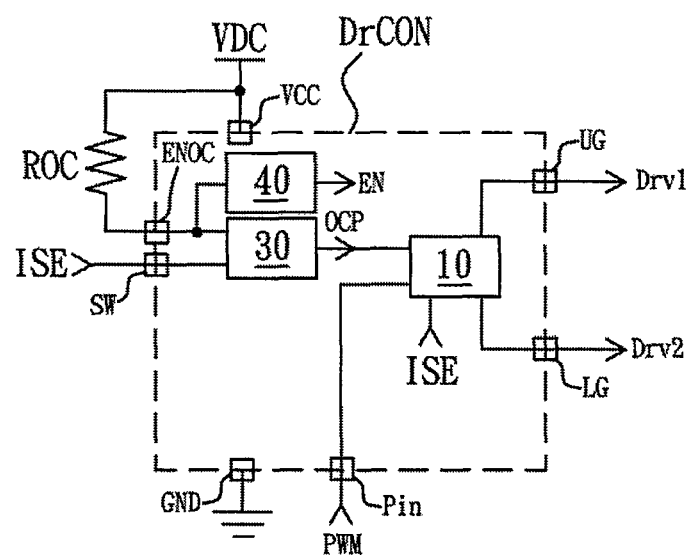
FIG. 3 is a schematic diagram of a controller with a multi-function pin according to an embodiment of the present invention.

FIG. 3 is a schematic diagram of a controller with a multi-function pin according to an embodiment of the present invention. Compared with the converting controller shown in FIG. 1, a feedback control unit 20 and a feedback pin FB of a controller DrCON are replaced with a modulation input pin Pin for receiving an external modulation signal PWM. A logic unit 10 generates driving signals Drv1, Drv2 according to the modulation signal PWM. The connections and operations of other circuits can be referred to the corresponding descriptions shown in FIG. 1.

Certainly, the high-side transistor SW1 and the low-side transistor SW2 may be built in the controller and the converting controller of the present invention without affecting the mentioned-above functions of the present invention.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A converting controller, adapted to control a converting circuit for converting an input voltage into an output voltage, comprising:
   a multi-function pin;
   an enable unit, coupled to the multi-function pin for receiving an enable signal and activating the converting controller in response to the enable signal;
   an over-current detecting unit, coupled to the multi-function pin and a current detecting pin, determining an over-current value according to an over-current set resistance which is coupled between the multi-function pin and a driving voltage source, and receiving a current flowing through the converting circuit according to the current detecting pin, wherein the over-current detecting unit generates an over-current protection signal according to the over-current value and the current;
   a feedback control unit, generating a modulation signal according to a feedback signal indicative of the output voltage; and
   a logic control unit, coupled to the over-current detecting unit and the feedback control unit, controlling the converting circuit according to the modulation signal and determining whether to execute an over-current protection according to the over-current protection signal,
   wherein the over-current detecting unit comprises a detecting current source, a detecting resistance and an over-current comparator,
   wherein the detecting current source is coupled to the detecting resistance through a connecting end, and the connecting end generates a connecting end voltage level according to the over-current value and the current, and the over-current comparator compares the connecting voltage level and a ground voltage level for generating the over-current protecting signal by the over-current detecting unit.

2. The converting controller according to claim 1, wherein the enable unit activates the converting controller when a voltage level of the multi-function pin is higher than an enable voltage level and stops the converting controller when the voltage level of the multi-function pin is lower than a shutdown voltage level, wherein the enable voltage level is higher than the shutdown voltage level.

3. The converting controller according to claim 1, wherein the over-current detecting unit comprises a counter which counts the number of times of the current being greater than the over-current value and generates the over-current protection signal when the times reaches a predetermined value.

4. The converting controller according to claim 3, wherein the enable unit activates the converting controller when a voltage level of the multi-function pin is higher than an enable voltage level and stops the converting controller when the voltage level of the multi-function pin is lower than a shutdown voltage level, wherein the enable voltage level is higher than the shutdown voltage level.

5. The converting controller according to claim 1, wherein the over-current detecting unit comprises an over-current set current source, which provides a set current flowing through the over-current set resistance, and determines the over-current value according to a voltage across the over-current set resistance.

6. The converting controller according to claim 5, wherein the enable unit activates the converting controller when a voltage level of the multi-function pin is higher than an enable voltage level and stops the converting controller when the voltage level of the multi-function pin is lower than a shutdown voltage level, wherein the enable voltage level is higher than the shutdown voltage level.

7. The converting controller according to claim 5, wherein the converting circuit comprises a high-side transistor, a low-side transistor, an inductance and a capacitance, in which a first end of the high-side transistor is coupled to the input voltage, a second end of the high-side transistor is coupled to a first end of the low-side transistor, a second end of the low-side transistor is coupled to a common level, an end of the inductance is coupled to the second end of the high-side transistor and the other end of the inductance is coupled to the capacitance for generating the output voltage.

8. A controller, adapted to control a converting circuit according to a control signal for converting an input voltage into an output voltage, comprising:
   a multi-function pin;
   an enable unit, coupled to the multi-function pin for receiving an enable signal and activating the controller in response to the enable signal;
   an over-current detecting unit, coupled to the multi-function pin and a current detecting pin, determining an over-current value according to an over-current set resistance coupled between the multi-function pin and a driving voltage source and receiving a current flowing through the converting circuit according to the current detecting pin, wherein the over-current detecting unit generates an over-current protection signal according to the over-current value and the current; and a logic control unit, coupled to the over-current detecting unit, controlling the converting circuit according to the control signal and determining whether to execute an over-current protection according to the over-current protection signal, wherein the over-current detecting unit comprises a detecting current source, a detecting resistance and an over-current comparator, wherein the detecting current source is coupled to the detecting resistance through a connecting end, and the connecting end generates a connecting end voltage level according to the over-current value and the current, and the over-current comparator compares the connecting voltage level and a ground voltage level for generating the over-current protecting signal by the over-current detecting unit.

9. The controller according to claim 8, wherein the enable unit activates the controller when a voltage level of the multi-function pin is higher than an enable voltage level and stops the controller when the voltage level of the multi-function pin is lower than a shutdown voltage level, wherein the enable voltage level is higher than the shutdown voltage level.

10. The controller according to claim 8, wherein the over-current detecting unit comprises a counter which counts the number of times of the current is greater than the over-current value and generates the over-current protection signal when the times reaches a predetermined value.

11. The controller according to claim 10, wherein the enable unit activates the controller when a voltage level of the multi-function pin is higher than an enable voltage level and stops the controller when the voltage level of the multi-function pin is lower than a shutdown voltage level, wherein the enable voltage level is higher than the shutdown voltage level.

12. The controller according to claim 8, wherein the over-current detecting unit comprises an over-current set current source which provides a set current flowing through the over-current set resistance and determines the over-current value according to a voltage across the over-current set resistance.

13. The controller according to claim 12, wherein the converting circuit comprises a high-side transistor, a low-side transistor, an inductance and a capacitance, in which a first end of the high-side transistor is coupled to the input voltage, a second end of the high-side transistor is coupled to a first end of the low-side transistor, a second end of the low-side transistor is coupled to a common level, an end of the inductance is coupled to the second end of the high-side transistor and the other end of the inductance is coupled to the capacitance for generating the output voltage.

14. The controller according to claim 12, wherein the enable unit activates the controller when a voltage level of the multi-function pin is higher than an enable voltage level and stops the controller when the voltage level of the multi-function pin is lower than a shutdown voltage level, wherein the enable voltage level is higher than the shutdown voltage level.

* * * * *